(12) United States Patent
Risaki et al.

(10) Patent No.: US 10,497,662 B2
(45) Date of Patent: Dec. 3, 2019

(54) SEMICONDUCTOR DEVICE AND BALL BONDER

(71) Applicant: SII Semiconductor Corporation, Chiba-shi, Chiba (JP)

(72) Inventors: Tomomitsu Risaki, Chiba (JP); Shoji Nakanishi, Chiba (JP); Hitomi Sakurai, Chiba (JP); Koichi Shimazaki, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/879,364

(22) Filed: Jan. 24, 2018

(65) Prior Publication Data

US 2018/0294243 A1    Oct. 11, 2018

Related U.S. Application Data

(63) Continuation of application No. 14/406,997, filed as application No. PCT/JP2013/063999 on May 21, 2013, now abandoned.

(30) Foreign Application Priority Data

Jun. 15, 2012    (JP) .................................. 2012-136288

(51) Int. Cl.
*H01L 23/00* (2006.01)
*H01L 23/528* (2006.01)
(Continued)

(52) U.S. Cl.
CPC .......... *H01L 24/45* (2013.01); *H01L 23/5226* (2013.01); *H01L 23/5283* (2013.01); *H01L 23/60* (2013.01); *H01L 24/05* (2013.01); *H01L 23/522* (2013.01); *H01L 24/48* (2013.01); *H01L 24/78* (2013.01); *H01L 24/85* (2013.01); *H01L 27/0296* (2013.01); *H01L 2224/02166* (2013.01); *H01L 2224/04042* (2013.01);
(Continued)

(58) Field of Classification Search
None
See application file for complete search history.

(56) References Cited

U.S. PATENT DOCUMENTS 6,313,537 B1 * 11/2001 Lee .................... H01L 24/03
                                                    257/758
6,448,641 B2    9/2002 Ker ........................... 257/700
(Continued)

OTHER PUBLICATIONS

European Search Report dated Oct. 20, 2016 in EP Application No. 13804750.1.
(Continued)

*Primary Examiner* — Steven B Gauthier
(74) *Attorney, Agent, or Firm* — Adams & Wilks

(57) ABSTRACT

In order to inhibit forming cracks under a pad opening during ball bonding without increasing a chip size, a protective film includes a pad opening that exposes a part of a topmost layer metal film of the chip. A second metal film provided under the pad opening has a ring shape that defines a rectangular opening under the pad opening. The opening edge of the opening in the second metal film extends inwardly beyond the edge of the overlying pad opening. Vias connect the second metal film and the topmost layer metal film, and all of these vias are located outside the pad opening in plan view.

11 Claims, 10 Drawing Sheets

(51) Int. Cl.
    *H01L 23/522*     (2006.01)
    *H01L 23/60*     (2006.01)
    *H01L 27/02*     (2006.01)

(52) U.S. Cl.
    CPC ............. *H01L 2224/05011* (2013.01); *H01L 2224/05013* (2013.01); *H01L 2224/05014* (2013.01); *H01L 2224/05085* (2013.01); *H01L 2224/05095* (2013.01); *H01L 2224/05096* (2013.01); *H01L 2224/05553* (2013.01); *H01L 2224/05554* (2013.01); *H01L 2224/05555* (2013.01); *H01L 2224/05599* (2013.01); *H01L 2224/45144* (2013.01); *H01L 2224/48451* (2013.01); *H01L 2224/48463* (2013.01); *H01L 2224/78301* (2013.01); *H01L 2224/78303* (2013.01); *H01L 2224/85181* (2013.01); *H01L 2224/85205* (2013.01); *H01L 2924/00014* (2013.01); *H01L 2924/35* (2013.01)

(56) References Cited

U.S. PATENT DOCUMENTS

| | | | |
|---|---|---|---|
| 7,115,985 B2 | 10/2006 | Antol | 257/700 |
| 7,253,531 B1* | 8/2007 | Huang | H01L 24/05 |
| | | | 257/784 |
| 7,385,297 B1* | 6/2008 | Gumaste | H01L 24/05 |
| | | | 257/784 |
| 8,148,797 B2 | 4/2012 | Weng | 257/503 |
| 2006/0065969 A1 | 3/2006 | Antol | 257/700 |
| 2006/0125118 A1 | 6/2006 | Yamazaki | 257/784 |
| 2008/0001296 A1* | 1/2008 | Tu | H01L 23/525 |
| | | | 257/762 |
| 2008/0079168 A1 | 4/2008 | Barth | 257/773 |
| 2009/0102059 A1* | 4/2009 | Ishii | H01L 23/5226 |
| | | | 257/774 |
| 2010/0001412 A1* | 1/2010 | Chang | H01L 23/522 |
| | | | 257/782 |

OTHER PUBLICATIONS

Patent Abstracts of Japan, Publication No. 04-069942, Publication Date Mar. 5, 1992.
Patent Abstracts of Japan, Publication No. 11-186320, Publication Date Jul. 9, 1999.
Patent Abstracts of Japan, Publication No. 2011-055006, Publication Date Mar. 17, 2011.

* cited by examiner

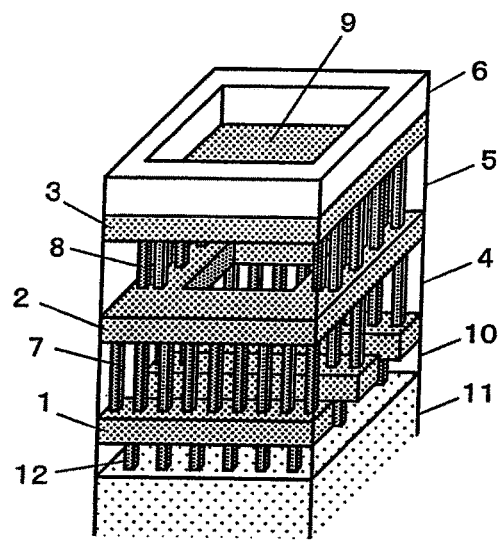
Fig. 1(a)
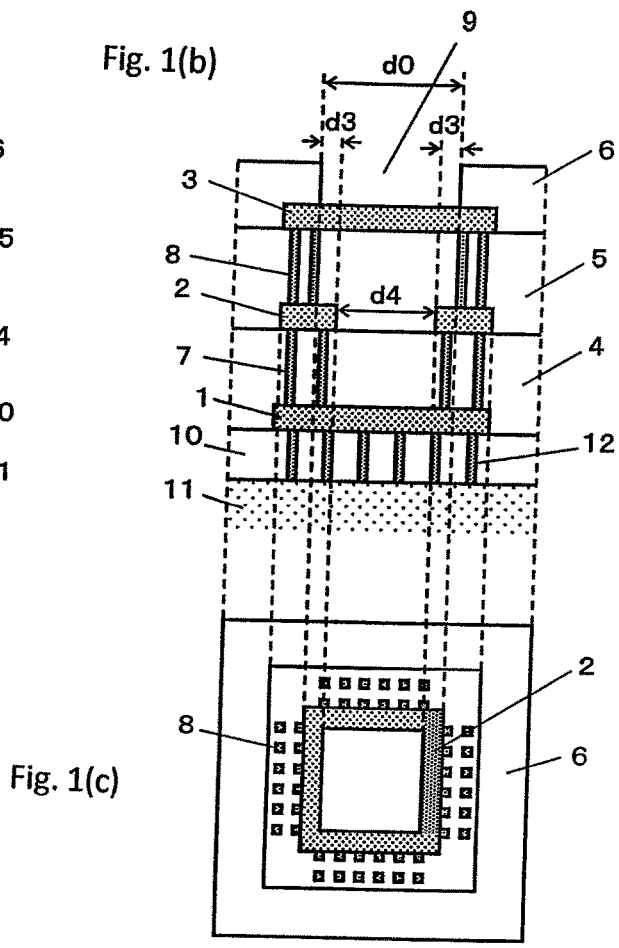
Fig. 1(b)
Fig. 1(c)

Fig. 11(a) Prior Art      Fig. 11(b) Prior Art
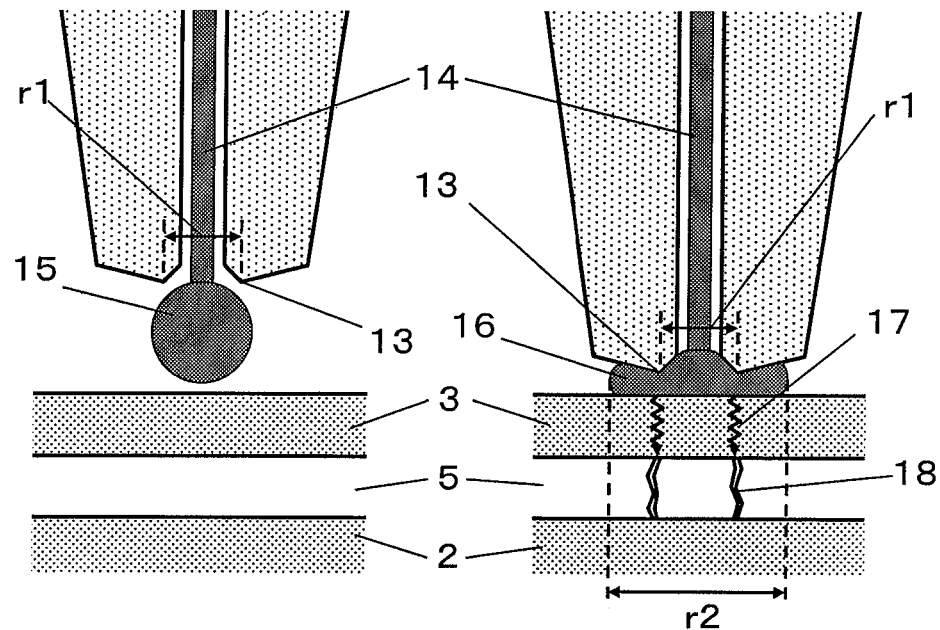
Fig. 12
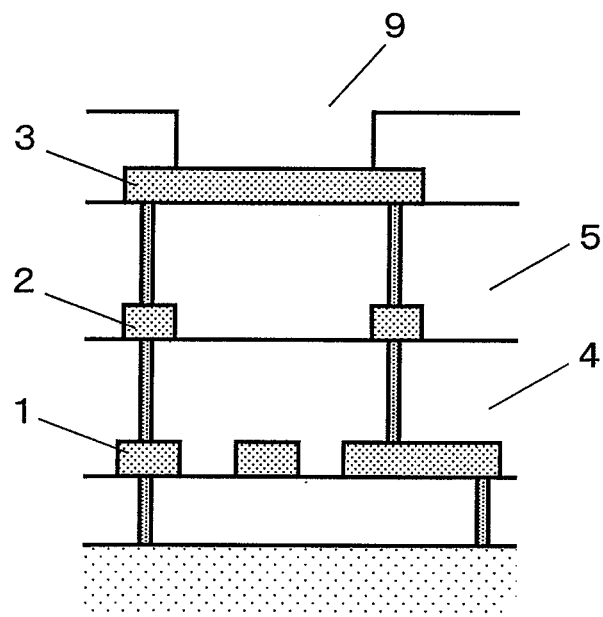

US 10,497,662 B2

SEMICONDUCTOR DEVICE AND BALL BONDER

RELATED APPLICATION

This application is a continuation of application Ser. No. 14/406,997 filed Dec. 10, 2014, which is a U.S. national stage of International Application No. PCT/JP2013/063999 filed May 21, 2013 claiming priority of Japanese Application No. 2012-136288 filed Jun. 15, 2012, the entire contents of which are incorporated herein by reference.

TECHNICAL FIELD

The present invention relates to a semiconductor device having a pad structure.

BACKGROUND ART

In a semiconductor device, wire bonding is used to connect a pad of the semiconductor device to an external connection terminal through a metal wire to exchange electrical signals with the outside. Since the wire bonding is a mechanical process of bonding a wire formed of gold or the like to the pad of the semiconductor device with use of heat, ultrasound, or weight, the semiconductor device may thereby receive damage. Detail is described with reference to FIGS. 11(a) and 11(b). As illustrated, the ball bonder comprises a capillary C through which a bonding wire 14 is fed. The capillary has a tip having a beveled corner 13. A wire ball 15 formed at a tip of the bonding wire 14 is press-fitted, by downward movement of the capillary C, to a topmost layer metal film 3 in a pad opening formed in the semiconductor device, becoming a crushed ball 16, and the bonding wire 14 is thus bonded to the topmost layer metal film 3 in the pad opening. During crushing of the wire ball 15 into the crushed ball 16, the beveled corner 13 deforms the wire ball as illustrated in FIG. 11(b). At this time, a crack 18 may develop in an insulating film 5 formed under the pad opening, which affects reliability of the semiconductor device.

Patent Literature 1 describes that, by devising a capillary structure of a ball bonding apparatus for the purpose of preventing a crack, bonding damage is inhibited, and development of a crack can be inhibited.

In Background Art of Patent Literature 2, it is described that, in order to keep strength against bonding so as to prevent a crack, there is formed a thick metal film in the pad opening in direct contact with the bonding wire. The metal film itself absorbs the bonding damage, inhibiting a crack and enhancing the crack resistance of the pad structure itself.

Further, in Patent Literature 3, as illustrated in FIG. 12, there is disclosed a pad structure in which an effective thickness of an insulating film formed under a pad opening 9 that receives the bonding damage is increased. A second metal film 2 is not formed under the topmost layer metal film 3 in the pad opening 9. A thickness of insulating films between a first metal film 1 and the topmost layer metal film 3 is a sum of a thickness of a second insulating film 4 and a thickness of a third insulating film 5, and an effective thickness of the insulating films formed under the pad opening 9 that receives the bonding damage is increased. The thick insulating film absorbs the bonding damage, inhibiting a crack. Arrangement of wiring and the like of the first metal film 1 under the pad opening 9 can reduce the chip size.

CITATION LIST

Patent Literature

[PTL 1] JP 04-069942 A
[PTL 2] JP 2011-055006 A
[PTL 3] JP 11-186320 A

Technical Problem

In the case of Patent Literature 1, when the strength against bonding is reduced, a disadvantage in that the wire bonding is liable to be disconnected may easily occur.

In the case of Patent Literature 2, the topmost layer metal film in the pad structure becomes thick, and processing of the metal film becomes difficult. As a result, the wiring width of the metal film cannot be sufficiently reduced, and the chip size increases.

In the structure of Patent Literature 3 illustrated in FIG. 12, in order to reduce a parasitic resistance to an element in a semiconductor device of the pad structure so as not to affect electrical characteristics of an IC, as illustrated in FIG. 13(a), a distance d1 from an opening edge of the pad opening 9 to an edge of the topmost layer metal film 3 of the pad structure is increased, or alternatively, as illustrated in FIG. 13(b), a distance d2 from an edge of the topmost layer metal film 3 of the pad structure to an edge of the second metal film 2 is increased, to thereby enable a large number of vias to be arranged. However, the larger pad structure as illustrated in sectional views of FIG. 13 accordingly increases the chip size.

SUMMARY OF INVENTION

The present invention has been made in view of the drawback that the chip size increases as described above, and an object of the present invention is to provide a semiconductor device that inhibits a crack under a pad opening without increasing a chip size.

Solution to Problem

According to one embodiment of the present invention, in order to solve the problem described above, there is provided a semiconductor device having a pad structure, the semiconductor device including: a metal film having a rectangular opening under a pad opening, the metal film having a rectangular donut shape, the metal film protruding to an inner side of the pad opening by a predetermined distance, being absent under a beveled corner at a tip of a capillary for a ball bonder in ball bonding; an insulating film formed on the metal film; a topmost layer metal film formed on the insulating film; a via for electrically connecting the metal film and the topmost layer metal film, being absent under the pad opening; and a protective film formed on the topmost layer metal film, the protective film having a rectangular pad opening that exposes a part of the topmost layer metal film.

Advantageous Effects of Invention

In the pad structure according to one embodiment of the present invention, the metal film under the topmost layer metal film in the pad opening exists not only on an outer side of the pad opening but also on the inner side of the pad opening except for a portion under the beveled corner at the tip of the capillary for the ball bonder in ball bonding. The area of the metal film under the topmost layer metal film in the pad opening accordingly becomes larger, reducing the parasitic resistance to the element in the semiconductor device without enlarging the pad structure.

Further, in the pad structure according to one embodiment of the present invention, absence of the metal film under the topmost layer metal film in the pad opening inside the pad opening under the beveled corner at the tip of the capillary for the ball bonder in ball bonding increases an effective thickness of the insulating film formed under the pad opening that receives bonding damage under the beveled corner. The thick insulating film absorbs the bonding damage, thus inhibiting a crack.

BRIEF DESCRIPTION OF DRAWINGS

FIGS. 1(a)-1(c) are views illustrating a pad structure of the present invention.

FIGS. 11(a)-11(b) are views illustrating bonding damage in ball bonding.

FIG. 12 is a view illustrating a related-art pad structure.

DETAILED DESCRIPTION OF EMBODIMENTS

Figure 2:
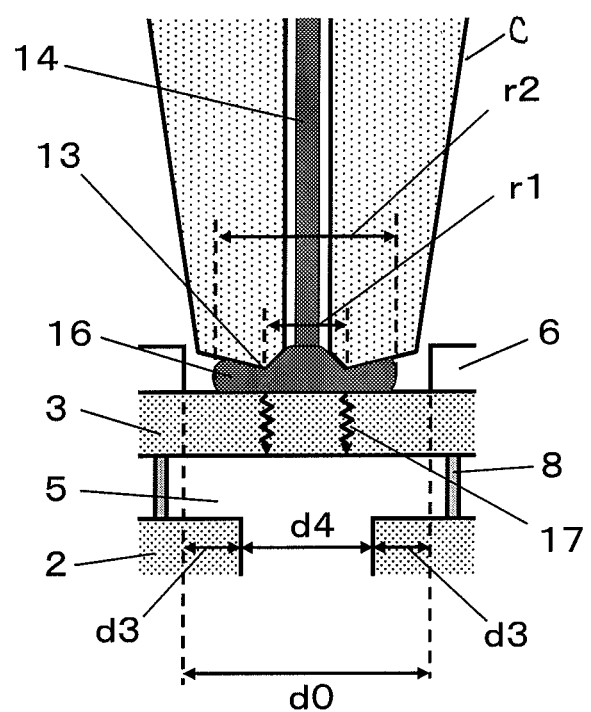
FIG. 2 is a view when ball bonding to the pad structure is performed.

Embodiments of the present invention are described in the following with reference to the drawings.

First, a pad structure of a semiconductor device of the present invention is described with reference to FIG. 1. FIG. 1(a) is a perspective view, FIG. 1(b) is a sectional view, and FIG. 1(c) is a plan view for illustrating a relationship between a second metal film and a pad opening, and a topmost layer metal film 3 is omitted in FIG. 1(c).

An element (not shown) is formed in a semiconductor substrate 11. A first insulating film 10 is formed on the semiconductor substrate 11, and a first metal film 1 is formed on the first insulating film 10. The element and the first metal film 1 are electrically connected to each other through contacts 12. A second insulating film 4 is formed on the first metal film 1, and a second metal film 2 is formed on the second insulating film 4. The first metal film 1 and the second metal film 2 are electrically connected to each other through first vias 7 formed in the second insulating film 4. A third insulating film 5 is formed on the second metal film 2, and the topmost layer metal film 3 is formed on the third insulating film 5. The second metal film 2 and the topmost layer metal film 3 are electrically connected to each other through second vias 8 that are not arranged under a pad opening 9. A protective film 6 is formed on the topmost layer metal film 3.

The protective film 6 includes the pad opening 9 that exposes a part of the topmost layer metal film 3. The pad opening 9 is rectangular, and further, in this case, square, having an opening width of d0. The second metal film 2 has an opening under the pad opening 9. This opening is also rectangular (in plan view), in this case, square, having an opening width of d4. A distance between an opening edge of the protective film 6 and an opening edge of the second metal film 2 is d3. The second metal film 2 has a square ring shape in this embodiment, and protrudes to an inner side of the pad opening 9 by the distance d3. The distance d3 is an amount of the protrusion of the second metal film 2. There is a relationship among the lengths: d0=d3×2+d4, or d3=(d0−d4)/2. In general, the second metal film 2 only needs to have a ring shape. Absence of the second metal film 2 at a place immediately below the pad opening 9 to the topmost layer metal film 3 increases the effective thickness of the insulating film under the pad opening 9.

As already described, FIGS. 11(a)-11(b) are views illustrating bonding damage in ball bonding. When cracks 18 develop due to the bonding damage, the cracks 18 do not develop under edges of a crushed ball 16 but develop under a beveled corner 13 at a tip of a capillary for a ball bonder. Specifically, with reference to FIG. 11(b), the cracks 18 develop so as to have a width r1 of the beveled corners illustrated in FIG. 11(a), not a width r2 of the crushed ball 16.

As illustrated in FIG. 2, since the crushed ball 16 extends to have the width r2, the opening width d0 of the pad opening 9 is set to be larger than the width r2 (d0>r2). Further, the opening width d4 of the second metal film 2 under the pad opening 9 is set to be larger than the width r1 of the beveled corner 13 (d4>r1) i.e., the width r1 of the beveled corner 13 is smaller than the width d4. Developed bonding damage 17 travels from the beveled corner 13 at the tip of the capillary C for the ball bonder to the topmost layer metal film 3 in the pad opening 9. Since the second metal film 2 does not exist under the beveled corner 13 at the tip of the capillary for the ball bonder in the ball bonding, a sum of the thickness of the second insulating film 4 and the thickness of the third insulating film 5 becomes the thickness of insulating films between the first metal film 1 and the topmost layer metal film 3, which receives the bonding damage 17.

As described above, in the pad structure, the second metal film 2 under the topmost layer metal film 3 in the pad opening 9 exists not only on an outer side of the pad opening 9 but also on the inner side of the pad opening 9 except for a portion under the beveled corner 13 at the tip of the capillary for the ball bonder in the ball bonding. The area of the metal film 2 under the topmost layer metal film 3 in the pad opening 9 becomes larger accordingly. The number of the vias between the second metal film and the topmost layer metal film and the number of the vias between the first metal film and the second metal film can thus be increased without enlarging the pad structure, which reduces a parasitic resistance to the element in the semiconductor device due to the pad structure. Alternatively, keeping the value of the parasitic resistance to the same value as that of the related art by keeping the number of the vias, the respective metal films can be reduced in size by the protrusion of the second metal film to the inner side.

Further, in the pad structure, absence of the second metal film 2 under the topmost layer metal film 3 in the pad opening 9 under the beveled corner 13 at the tip of the capillary for the ball bonder in the ball bonding inside the pad opening 9 under the beveled corner 13 increases the effective thickness of the insulating film formed under the pad opening 9 that receives the bonding damage 17. The thick insulating film absorbs the bonding damage 17, inhibiting a crack.

Further, when the element under the pad opening 9 is an ESD protection element, increase in an area of the second metal film 2 accordingly permits arrangement of a larger number of the first vias 7 on the second metal film 2, reducing the parasitic resistance between the pad structure and the ESD protection element. Thus concentration of current reduces and an ESD tolerance of the ESD protection element becomes higher.

It is noted that, in the above description, a case in which an element such as an ESD protection element exists under the pad opening 9 is described, the present invention is not limited thereto. The element such as an ESD protection element may be formed away from the pad, in which the element and the pad are electrically connected to each other through the first metal film, the second metal film, and the like.

Further, in the above description, the semiconductor device is manufactured using a three-layer metal process, but the present invention is not limited thereto. The semiconductor device may be manufactured using a two-layer metal process.

Further, in the above description, both the pad opening 9 formed in the protective film 6 and the opening formed in the second metal film 2 are square, but the present invention is not limited thereto. Insofar as the relationship between the lengths expressed by the inequality used in the description is satisfied, the two openings may be rectangular or circular. Various kinds of combinations are possible.

Modified Example 1

Figure 3:
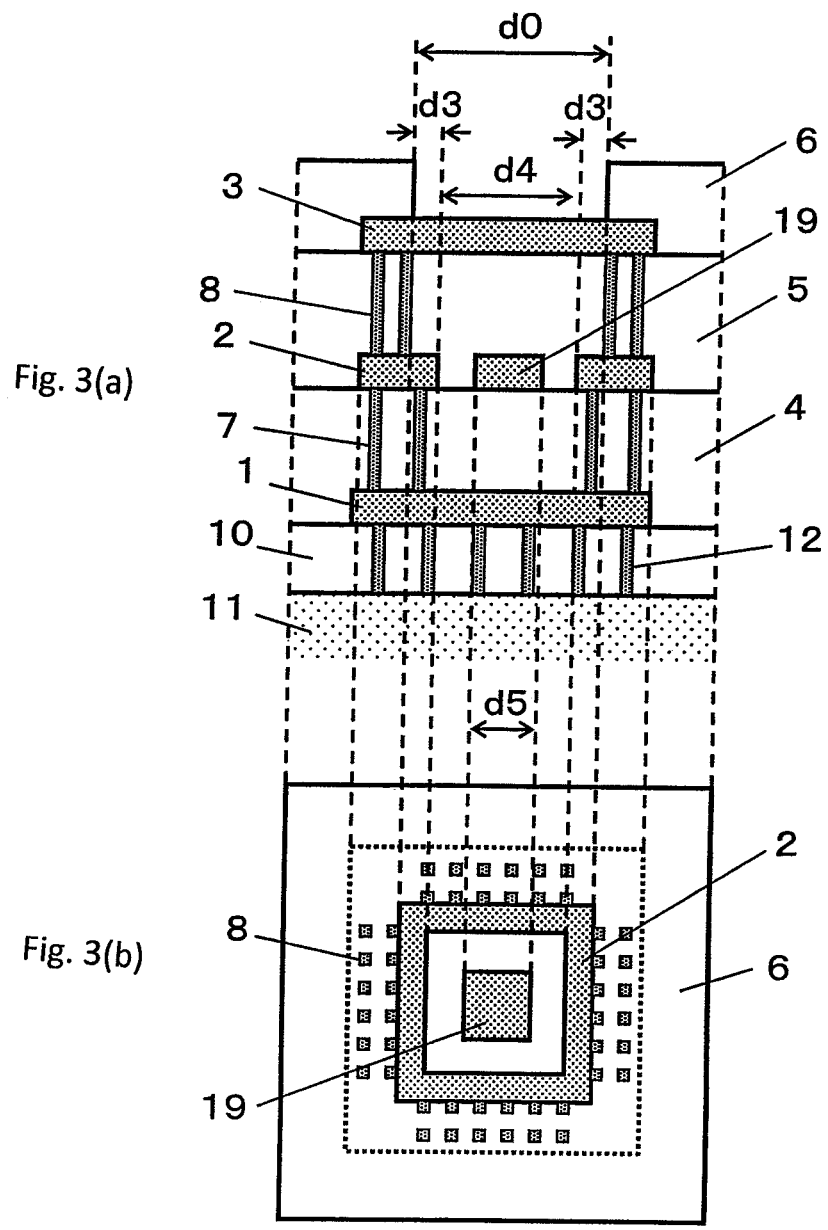
FIGS. 3(a)-3(b) are views illustrating a pad structure of the present invention.
Figure 4:
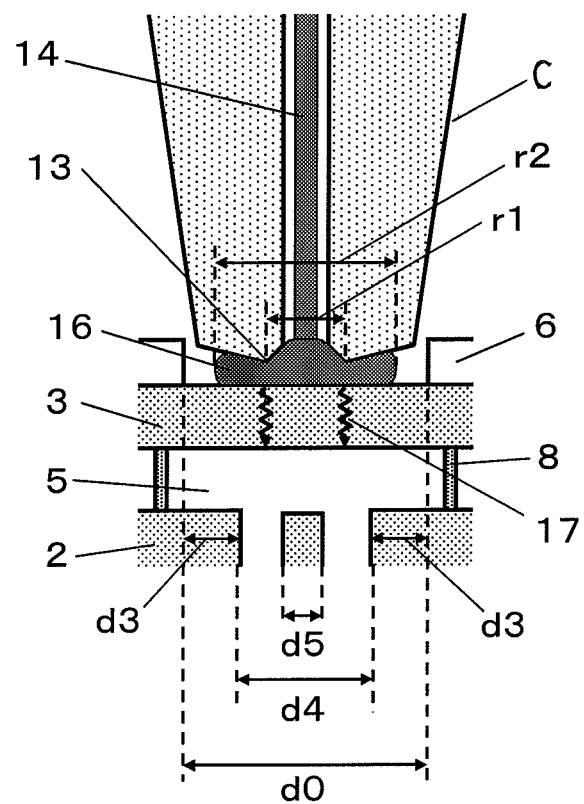
FIG. 4 is a view when ball bonding to the pad structure is performed.

FIG. 3 illustrate another pad structure of the present invention. FIG. 3(*a*) is a sectional view, and FIG. 3(*b*) is a plan view mainly for illustrating a relationship between the second metal film and the pad opening. FIG. 4 is a view illustrating a case in which ball bonding to the pad structure is performed.

As compared with the embodiment described above, this case is different in that the second part of the second metal film 19 is formed rectangular under the pad opening 9 so as not to be held in contact with the first part of the second metal film 2 having a rectangular ring shape and formed under the pad opening 9. It is necessary that, as illustrated in FIG. 4, a width d5 of the second part of the second electrode film 19 be smaller than the width r1 of the beveled corners (d5<r1).

As illustrated in FIG. 4, since the bonding damage 17 develops from the beveled corner 13 at the tip of the capillary for the ball bonder to the topmost layer metal film 3 in the pad opening 9, the second part of the second metal film 19 is formed so as not to be directly below the beveled corner 13 and so as to be completely within the width r1 of the beveled corners. Thus the effective thickness of the insulating film formed under the pad opening 9 that receives the bonding damage 17 remains large. The thick insulating film absorbs the bonding damage 17, inhibiting a crack.

Figure 5:
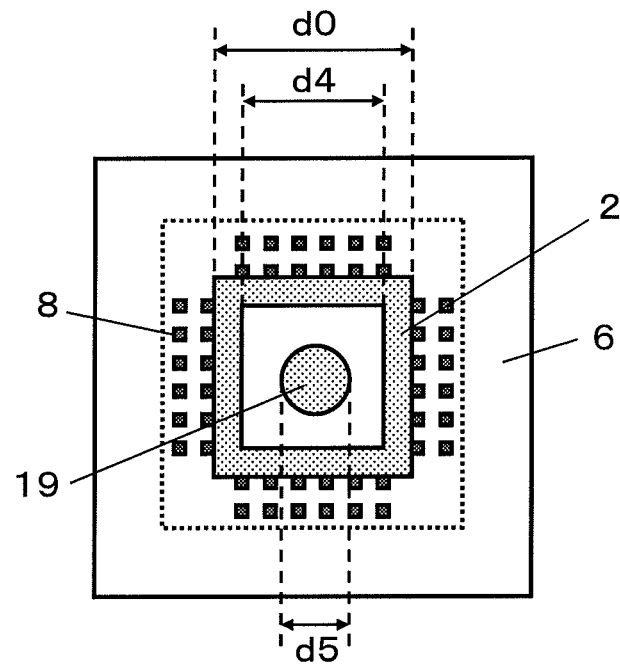
FIG. 5 is a view illustrating a pad structure of the present invention.
Figure 6:
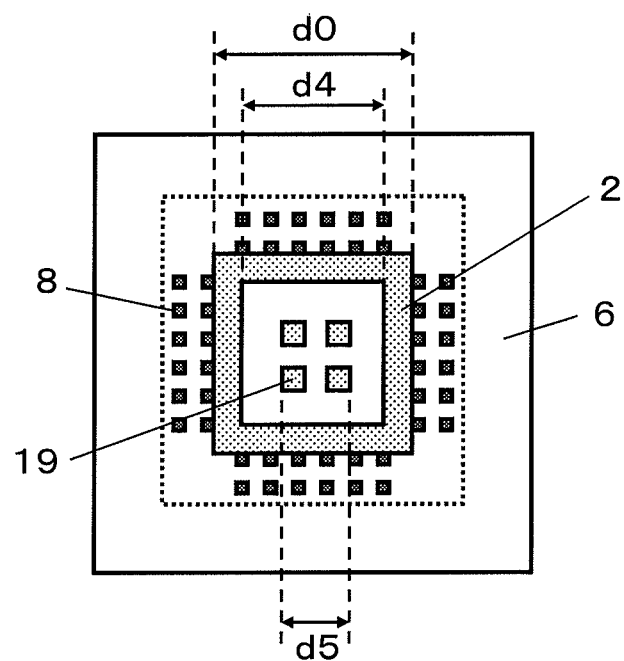
FIG. 6 is a view illustrating a pad structure of the present invention.

It is noted that the second part of the second metal film 19 may be circular as illustrated in FIG. 5. Further, the second part of the second metal film 19 may be a combination including a plurality of rectangles as illustrated in FIG. 6. Further, the second part of the second metal film 19 may be a combination including a plurality of circles (not shown).

Modified Example 2

Figure 7:
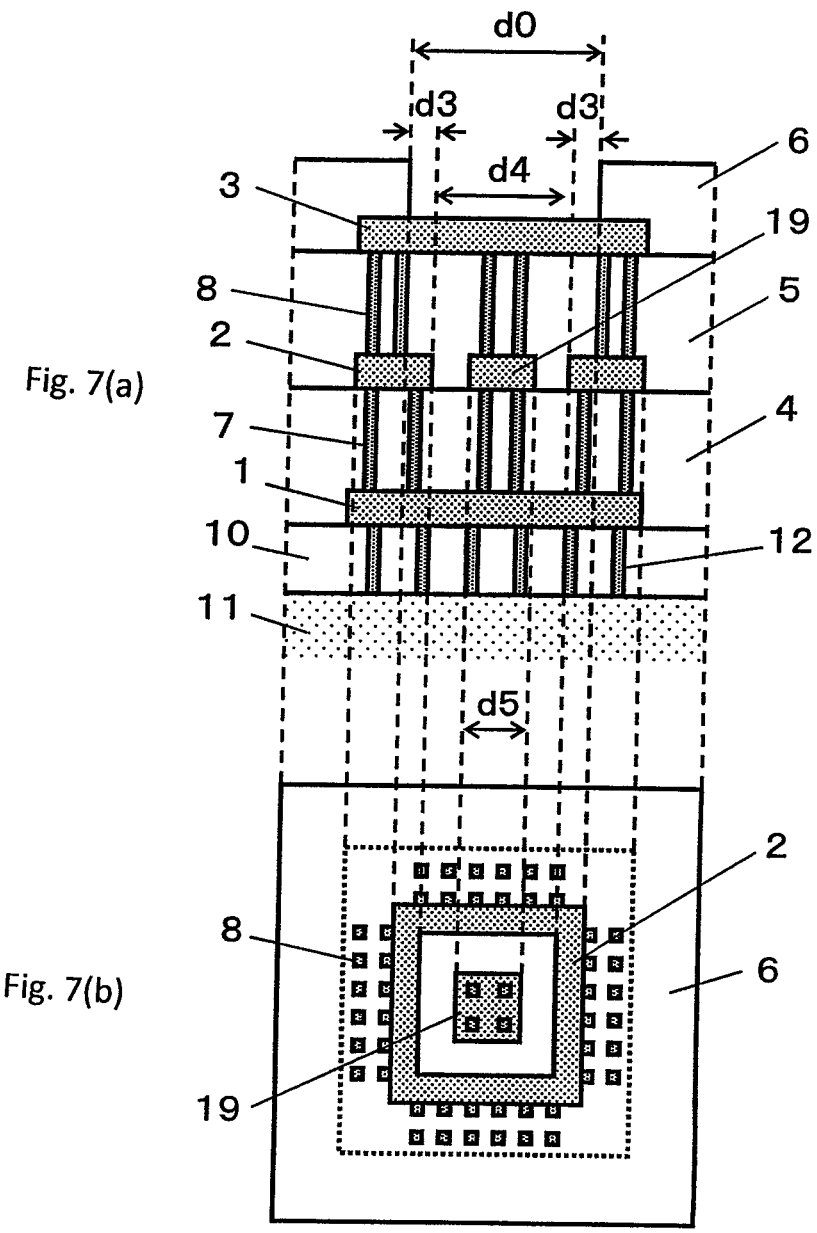
FIGS. 7(a)-7(b) are views illustrating a pad structure of the present invention.

FIG. 7 are views illustrating a pad structure of the present invention. FIG. 7(*a*) is a sectional view, and FIG. 7(*b*) is a plan view mainly for illustrating a relationship between the second metal film and the pad opening.

As compared with Modified Example 1, this case is different in that the second part of the second metal film 19 is electrically connected to the topmost layer metal film 3 through the second vias 8. Further, the second part of the second metal film 19 is also electrically connected to the first metal film 1 through the first vias 7.

In the pad structure, new contribution of the first vias 7, the second vias 8, and the second metal film 19 to electrical conduction reduces the parasitic resistance included in the pad structure.

Figure 8:
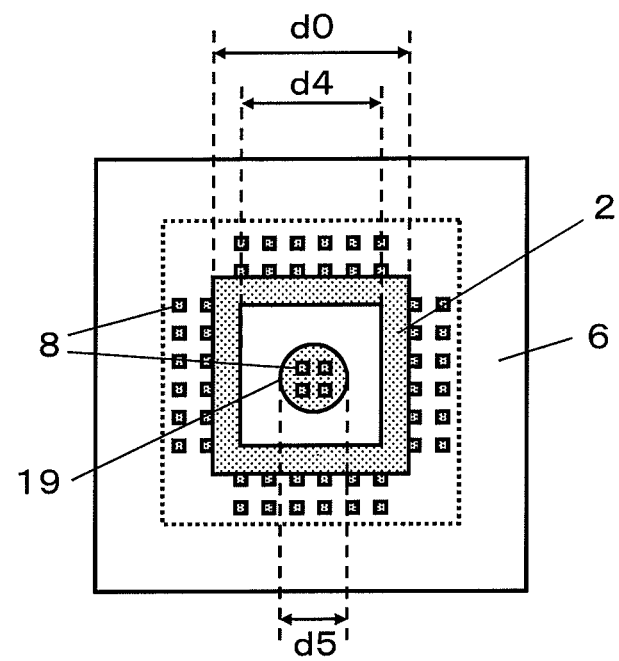
FIG. 8 is a view illustrating a pad structure of the present invention.
Figure 9:
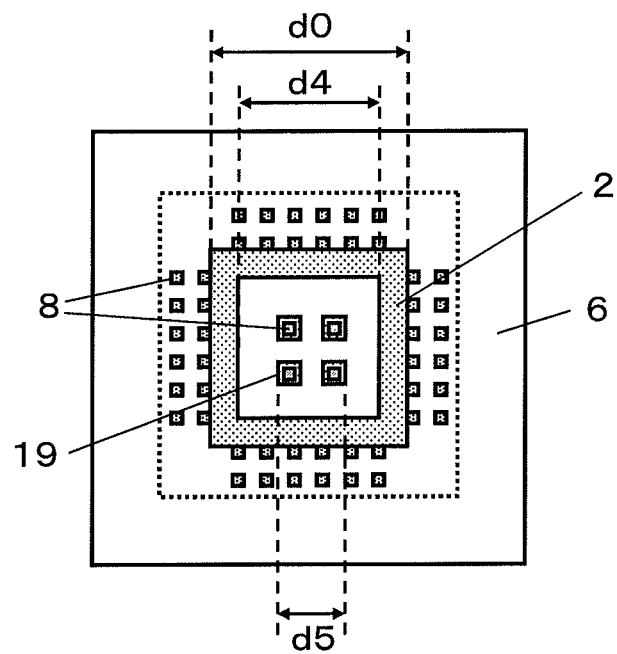
FIG. 9 is a view illustrating a pad structure of the present invention.

It is noted that, as illustrated in FIG. 8, similarly to FIG. 5, the second part of the second metal film 19 may be circular and the second vias 8 may be arranged therein. Further, as illustrated in FIG. 9, similarly to FIG. 6, the second part of the second metal film 19 may be a pattern including rectangles and the second vias 8 may be arranged therein.

Modified Example 3

Figure 10:
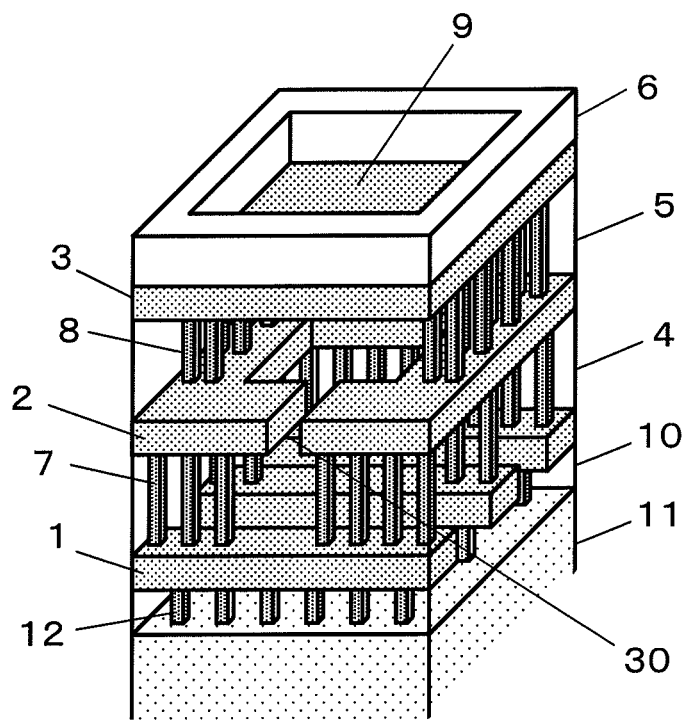
FIG. 10 is a view illustrating a pad structure of the present invention.
Figure 13A:
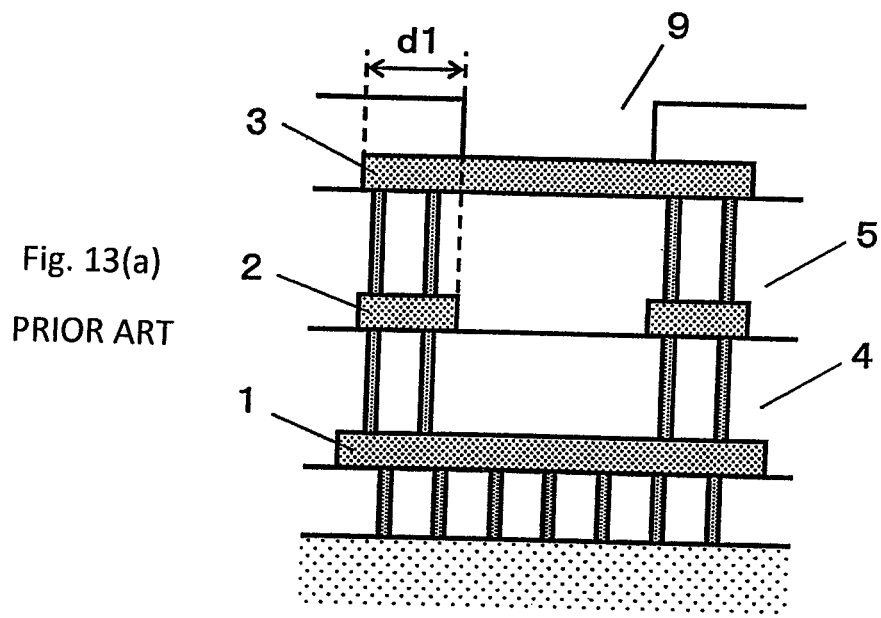
FIGS. 13(a)-13(b) are views illustrating a related-art pad structure.
Figure 13B:
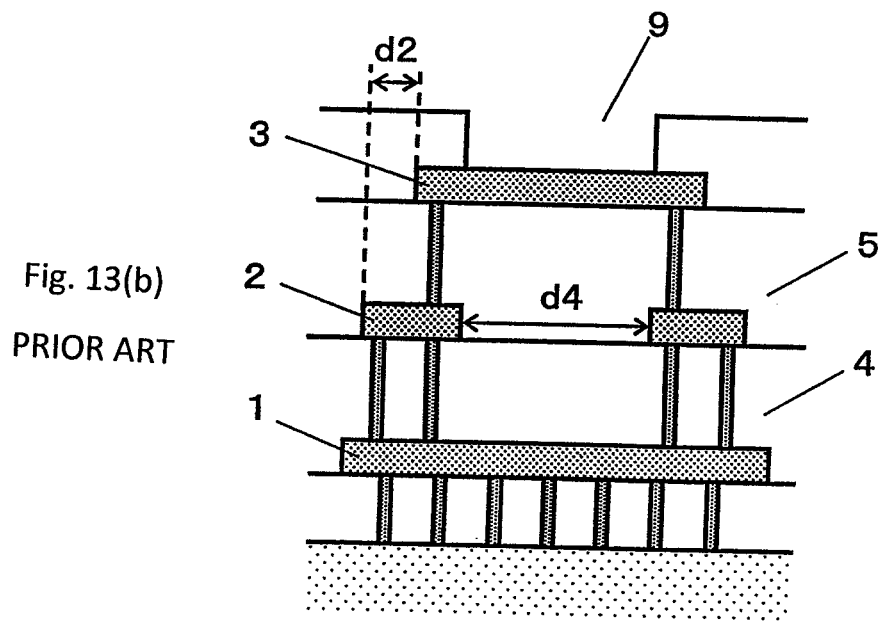

FIG. 10 is a view illustrating a pad structure of the present invention.

As compared with the embodiment described above, this case is different in that the second metal film 2 having a rectangular ring shape, which is formed under the pad opening 9, includes a slit 30 as illustrated in FIG. 10.

It is noted that the second metal film 2 may be U-shaped, L-shaped, or other shape (not shown) under constraints of a layout pattern.

REFERENCE SIGNS LIST 1 first metal film
2 second metal film
3 topmost layer metal film
4 second insulating film
5 third insulating film
6 protective film
7 first via
8 second via
9 pad opening
10 first insulating film
11 semiconductor substrate
12 contact
13 beveled corner at tip of capillary for ball bonder
14 bonding wire
15 balled wire
16 crushed ball
17 bonding damage
18 crack
19 second metal film

We claim:

1. In combination: a semiconductor device having a pad opening; and a ball bonder configured to bond a wire to the semiconductor device in the pad opening;

wherein the semiconductor device comprises:

a semiconductor substrate;

a first insulating film formed on a surface of the semiconductor substrate;

a first metal film formed on the first insulating film;

a second insulating film formed on the first metal film;

a first part of a second metal film formed on the second insulating film;

first vias formed in the second insulating film to connect the first metal film and the first part of the second metal film;

a third insulating film formed on the first part of the second metal film;

a topmost layer metal film formed on the third insulating film;

second vias formed in the third insulating film to connect the first part of the second metal film and the topmost layer metal film; and a protective film formed on the topmost layer metal film and having a pad opening formed therein to expose a part of a surface of the topmost layer metal film, the first metal film being connected to the semiconductor substrate through contacts formed in the first insulating film under the topmost layer metal film, the first part of the second metal film having a ring shape defining an opening that is rectangular in plan view under the pad opening, an edge of the first part of the second metal film that defines the opening being located inside the pad opening in plan view, and all of the second vias consisting of vias that connect the first part of the second metal film and the topmost layer metal film being located outside the pad opening in plan view; and wherein the ball bonder comprises:

a capillary through which a wire is fed for bonding directly to the topmost layer metal film in the pad opening of the semiconductor device, the capillary having a tip through which the wire is fed, and the tip having a width smaller than a width of the pad opening and having a beveled corner having a width smaller than a width of the opening in the second metal film of the semiconductor device, and wherein a width of the opening in the first part of the second metal film is less than a diameter of a crushed ball on the topmost layer metal film.

2. The combination according to claim 1, wherein both the pad opening and the opening are square.

3. The combination according to claim 1, further comprising a second part of the second metal film formed under the pad opening, the second part of the second metal film being rectangular or circular in cross section.

4. The combination according to claim 3, wherein the second part of the second metal film is electrically connected to the topmost layer metal film through the second vias.

5. The combination according to claim 1, further comprising a second part of the second metal film formed under the pad opening, the second part of the second metal film comprising a combination including a group of a plurality of rectangles or circles in cross section.

6. The combination according to claim 1, wherein the first part of the second metal film has a slit formed therein.

7. The combination according to claim 1, further comprising an element formed under the pad opening.

8. The combination according to claim 7, wherein the element is an ESD protection element.

9. In combination: a semiconductor device having a pad opening; and a ball bonder configured to bond a wire to the semiconductor device in the pad opening;

wherein the semiconductor device comprises:

a semiconductor substrate;

a first insulating film formed on a surface of the semiconductor substrate;

a first metal film formed on the first insulating film;

a second insulating film formed on the first metal film;

a second metal film formed on the second insulating film and having a ring shape defining a rectangular opening that extends through the second metal film;

first conductive vias extending through the second insulating film to electrically connect the first metal film and the second metal film;

a third insulating film formed on the second metal film;

a topmost layer metal film formed on the third insulating film;

second conductive vias extending through the third insulating film to electrically connect the second metal film and the topmost layer metal film; and a protective film formed on the topmost layer metal film and having a pad opening formed therein that exposes a part of a surface of the topmost layer metal film, wherein the first metal film is electrically connected to the semiconductor substrate through contacts formed in the first insulating film under the topmost layer metal film, the rectangular opening is located entirely inside the pad opening in plan view, and all of the second conductive vias consisting of vias that connect the first part of the second metal film and the topmost layer metal film being located outside the pad opening in plan view, and wherein the ball bonder comprises:

a capillary through which a wire is fed for bonding directly to the topmost layer metal film in the pad opening of the semiconductor device, the capillary having a tip through which the wire is fed, and the tip having a width smaller than a width of the pad opening and having a beveled corner having a width smaller than a width of the opening in the second metal film of the semiconductor device, and wherein a width of the opening in the second metal film is less than a diameter of a crushed ball on the topmost layer metal film.

10. The combination according to claim 9, wherein the pad opening has a rectangular shape.

11. The combination according to claim 9, wherein the rectangular opening and the pad opening both have a square shape.

* * * * *